United States Patent [19]
Grogan

[11] 4,271,449
[45] Jun. 2, 1981

[54] METHOD AND APPARATUS FOR PROTECTING ALTERNATING CURRENT CIRCUITS

[75] Inventor: Martin L. Grogan, Marion, Iowa

[73] Assignee: Rockwell International Corporation, El Segundo, Calif.

[21] Appl. No.: 27,129

[22] Filed: Apr. 4, 1979

[51] Int. Cl.³ .......................................... H02H 3/093
[52] U.S. Cl. ........................................ 361/94; 361/96
[58] Field of Search ............... 361/94, 96, 97, 93, 361/110, 111, 87, 95, 98, 195, 196; 307/234, 293; 328/111

[56] References Cited
U.S. PATENT DOCUMENTS

| | | | |
|---|---|---|---|
| 3,790,881 | 2/1974 | Smith | 328/111 X |
| 3,896,341 | 7/1975 | Kodama | 307/234 X |
| 3,914,667 | 10/1975 | Waldron | 361/110 X |
| 4,082,986 | 4/1978 | Gamboa | 361/86 X |
| 4,152,744 | 5/1979 | Pang | 361/98 X |

Primary Examiner—Patrick R. Salce
Attorney, Agent, or Firm—Richard K. Robinson; Howard R. Greenberg; H. Fredrik Hamann

[57] ABSTRACT

A method and apparatus is disclosed for protecting a circuit from excessive current flow by pulse width modulation of a current sense signal and interrupting the circuit when the width of the pulse is less than a reference period.

4 Claims, 3 Drawing Figures

METHOD AND APPARATUS FOR PROTECTING ALTERNATING CURRENT CIRCUITS

BACKGROUND OF THE INVENTION

This invention relates to the method and apparatus for protecting alternating current circuits against excessive current flow.

In applications of alternating current circuits there is a requirement for a reliable, efficient and economical means for sensing alternating current levels or flow rates, and for protecting the alternating current circuit from damage in the event of short circuits caused by component failure or the low impedance presented by a saturated core of an AC circuit that has a transformer load which results from a repeated phase at turn on. The prior art discloses several apparatuses and methods for the protection of alternating current circuits. Among these are fuses, circuit breakers, precision current analog techniques and control transformer methods. In all of the above enumerated type devices, the main disadvantages have been inefficiency, unreliability, size and complexity.

SUMMARY OF THE INVENTION

A method and apparatus is disclosed for protecting a circuit from excessive current flow by pulse width modulation of a current sense signal and interrupting the circuit when the width of the pulse is less than a reference period.

In the alternating current circuit there is present a current sense transformer that provides a pulse immediately upon the reversal of the current in the sense transformer primary circuitry. The width of the pulse is monotonically related to the current rate of change at the current zero point. The sense transformer pulse width is compared with an internally generated reference period to detect a fault condition. A fault condition is indicated if the sense pulse is too narrow, and the load current will be interrupted upon the occurrence of each fault condition.

BRIEF DESCRIPTION OF THE DRAWINGS

FIG. 3 is a schematic diagram of the current protection device of FIG. 1.

DETAILED DESCRIPTION OF THE INVENTION

Figure 1:
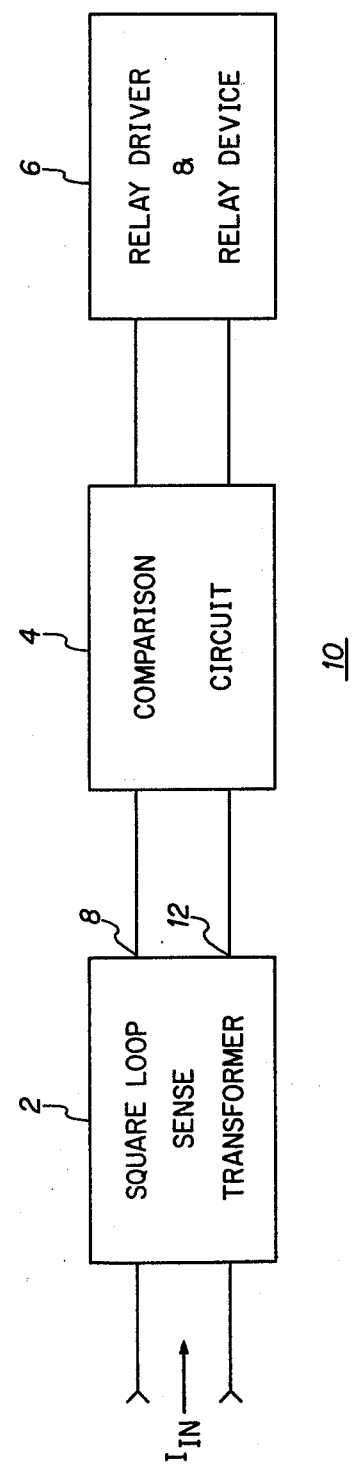
FIG. 1 is a block diagram of the current protection device according to the teachings of this invention.

Referring to FIG. 1, there is shown a current protection circuit 10 that includes a square loop sense transformer 2, a comparison circuit 4 and a relay driver and relay device 6. The square loop sense transformer 2 senses the alternating current that is flowing through its primary circuit and provides across its output, terminals 8 and 12, a pulse immediately upon the reversal of the current in the primary winding. The width of the pulse that is present across the terminals 8 and 12 is monotonically related to the current rate of change at the point where the net current flow is zero. The comparison circuit 4 compares the width of the pulse that is present across terminals 8 and 12 with an internally generated reference time period, and will indicate a fault condition if the width of the pulse is less than the reference period. The reference time period may be adjusted to reflect the current levels that are being monitored.

A fault condition is indicated if the sense pulse is too narrow causing the current flow to the load circuit to be interrupted by the relay driver and relay device 6. The relay driver and relay device 6 will maintain an interrupt condition until the unit is reset either automatically or manually.

Figure 2:
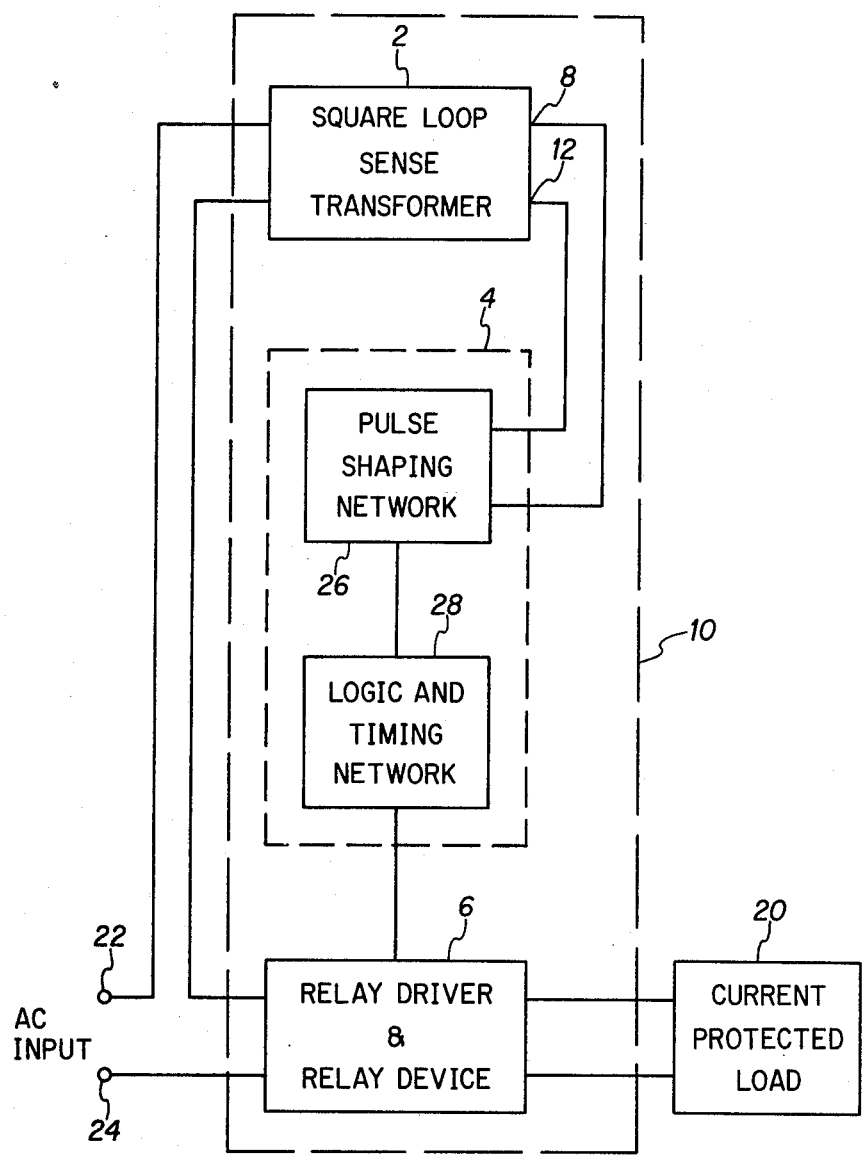
FIG. 2 is one embodiment of an alternating current circuit having a current protection device according to the teachings of this invention.
Figure 4:
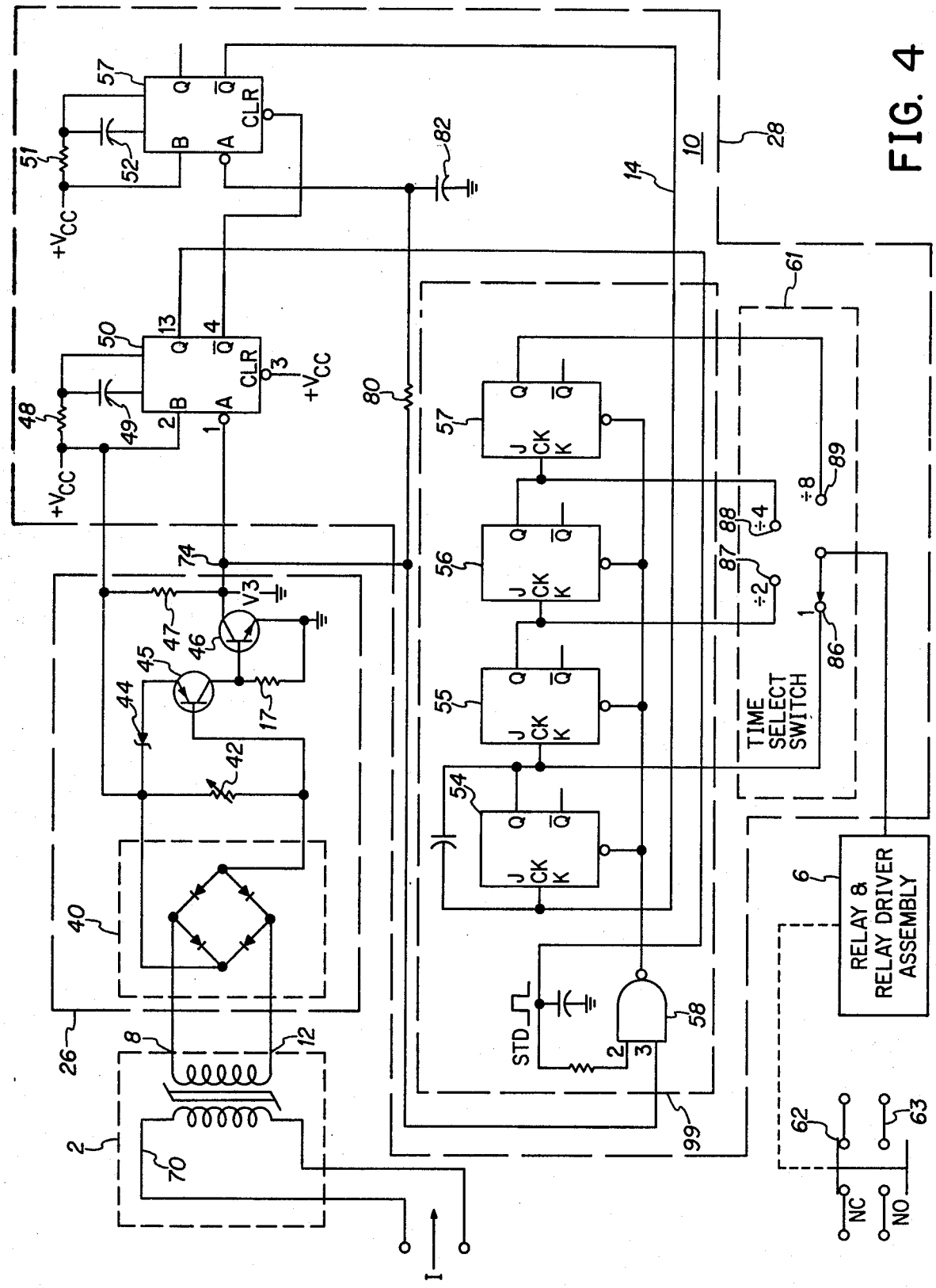

In FIG. 2 there is shown an alternating current electrical circuit which consists of terminals 22 and 24 that are connected to a source of alternating current (not shown) and to a current protected load 20. The current protection device 10 that includes the sense transformer 2 is in series with the load. The sense transformer 2 monitors the series current flow to the protected load 20 and, as discussed earlier, provides a pulse whose width is monotonically related to the current rate of change at the point where the net current flow is zero. The output from the sense transformer is applied to terminals 8 and 12 and also to the comparison circuit 4 that includes a pulse shaping network 26 and a logic and timing network 28. The pulse shaping network 26 modifies the shape of the pulse to make it more acceptable to the logic and timing networks 28 which generally are comprised of integrated circuit type devices. In the event the sense transformer 2 provides a pulse that is narrower than the reference time period that is present within the comparison circuit 4, the relay driver and relay device 6 will interrupt the current flow to the current protected load device 20 and periodically sample the current flow to the current protected load device until the fault condition has been removed. At this point, the circuit returns to the normal monitor mode of operation.

FIG. 3, a schematic diagram of the current protection device 10, shows the current I flowing through the primary winding 70 of the square loop sense transformer 2 which provides, as discussed earlier, pulses across the output terminals 8 and 12. The pulses are applied to the pulse shaping network 26 which includes a full wave rectifier device 40 which rectifies the pulses and applies them to a transistor switch circuit that includes the transistor switches 45 and 46. Bias for transistor switch 45 is provided by the current that is developed across the adjustable resistor 42 and the zener diode 44. When transistor switch 45 turns on, a positive bias is developed on the base of transistor switch 46 which then turns on and provides a negative going pulse on its collector. The biasing of transistor 46 is provided by the resistors 47 and 17. The negative going pulse that is present at node point 74 and ground is represented by $V_3$ is applied to the one shot multivibrator 50. The multivibrator 50 has its time out period, which is the time reference period established by the resistor 48 and capacitor 49.

The logic and timing network also includes a binary counter device 99 that is comprised of the NAND gate 58 and JK flip-flops 54, 55, 56 and 57. When the multivibrator 50 is set, it provides a positive going pulse to the input of the gate 58. The other terminal from gate 58 is connected to $V_3$ at node point 74. Therefore, the binary counter is enabled as long as the voltage across node point 74 is negative. If $V_3$ should go positive prior to the multivibrator 50 timing out, then the enabling command to the JK flip-flops as provided by the NAND gate 58 is removed. In addition, $V_3$, after going through a RC delay that is provided by resistor 80 and capacitor 82, is used to trigger the multivibrator 57. Multivibrator 57 has its time out period established by the RC time constant established by the external resistor 51 and capacitor 52. The turning on of the one shot multivibrator 57 causes the JK flip-flop 54 to turn on and provides an instantaneous strobe signal on conductor 14 if the output of NAND gate 58 is high. In addition, at the occurrence of the next pulse and after the multivibrator 57 has timed out and is again retriggered by $V_3$ going negative, JK flip-flop 54 turns off and JK flip-flop 55 turns on. Of course, this process is well known to those skilled in the art as normal operation of the binary counter. The important part is, that as long as the pulse width of $V_3$ that is present at node 74 is wider than the pulse width that is set by the time out of the one shot multivibrator 50, then there will be provided an enable signal from the NAND gate 58 to the binary counter. However, in the event that $V_3$ should be narrower than the time period that is established by the multivibrator 50, then the output from the NAND gate 58 will cause the JK flip-flops of the binary counter to reset.

The relay and relay driver assembly 6 is connected to the outputs from the binary counter by means of the time select switch 61. The time select switch 61 provides a delay after a reset condition has occurred and the circuit has been interrupted before reclosing the relay terminals. This is provided in combination with the multivibrator 57 and the binary counter. If the relay drive assembly is connected to terminal 86 then upon the first toggling of multivibrator 57 the relay driver assembly will be enabled. However, there is also provided two times the time out of multivibrator 57 on terminal 87, four times the time out of multivibrator 57 on terminal 88, and eight times the time out of multivibrator 57 on terminal 89.

Depending upon the embodiment of the relay control device, the contacts can be the normally closed type 62 or the normally open type represented by the terminals at 63.

Although the invention has been described and illustrated with a certain degree of particularity, it is understood that numerous changes in the arrangement and combination of parts may be resorted to without departing from the spirit and scope of the invention as hereafter claimed.

I claim:

1. An apparatus for protecting a circuit from excessive current flow, comprising:
   sense transformer means for sensing the current flow through the circuit;
   pulse shaping means for generating a sense pulse whose width is related to the rate of current flow into the sense transforming means;
   1st single shot multivibrator means for generating a reference period at the occurrence of each sense pulse;
   2nd single shot multivibrator means for providing a second pulse each time a sense pulse occurs;
   comparator means for providing an enabling command as long as the sense pulse's width is greater than the reference period and to provide a reset at a fault condition when the sense pulse's width is less than the reference period;
   selectable time delay means for providing a command signal after a fault condition and the occurrence of a selectable number of the second pulses; and
   relay means activated by the command signal.

2. A method for protecting a circuit from excessive current flow, comprising:
   sensing the current flow through a sensing circuit;
   generating a pulse whose width is related to the rate of current flow through the sensing circuit;
   generating a reference period;
   comparing the width of the pulse to the reference period;
   indicating a fault condition when the width of pulse is less than the reference condition; and
   inhibiting the current flow through the circuit for a selectable period of time after the occurrence of the fault condition.

3. The method according to claim 2 wherein the step of generating a pulse whose width is proportional to the rate of current flow through the sensing circuit comprises:
   passing the current flow in the sensing circuit through a first winding of a square loop transformer means, and rectifying the output of the transformer means.

4. The method according to claims 2 or 3 wherein the step of comparing the width of the pulse to the reference period comprises:
   triggering a one shot multivibrator means whose time out period is equal to the reference period with the pulse.

* * * * *